(12) United States Patent
Fehrenbach et al.

(10) Patent No.: US 11,353,355 B2
(45) Date of Patent: Jun. 7, 2022

(54) IMPEDANCE LIMIT SWITCH FOR REDUCING EMC RADIATION

(71) Applicant: VEGA Grieshaber KG, Wolfach (DE)

(72) Inventors: Dominik Fehrenbach, Rottweil (DE);
Juergen Haas, Oberwolfach (DE);
Christian Weinzierle, Wolfach (DE);
Volker Allgaier, Haslach i.K. (DE)

(73) Assignee: VEGA GRIESHABER KG, Wolfach (DE)

( * ) Notice: Subject to any disclaimer, the term of this patent is extended or adjusted under 35 U.S.C. 154(b) by 625 days.

(21) Appl. No.: 16/351,838

(22) Filed: Mar. 13, 2019

(65) Prior Publication Data

US 2019/0293471 A1 Sep. 26, 2019

(30) Foreign Application Priority Data

Mar. 22, 2018 (EP) .................................... 18163330

(51) Int. Cl.
| | |
|---|---|
| *G01F 23/26* | (2022.01) |
| *G01F 23/263* | (2022.01) |
| *G01N 27/22* | (2006.01) |
| *G01R 29/08* | (2006.01) |
| *G01F 23/284* | (2006.01) |
| *G01R 27/26* | (2006.01) |
| *G01F 23/80* | (2022.01) |

(Continued)

(52) U.S. Cl.
CPC ............ *G01F 23/26* (2013.01); *G01F 23/265* (2013.01); *G01F 23/266* (2013.01); *G01F 23/284* (2013.01); *G01F 23/80* (2022.01); *G01N 27/22* (2013.01); *G01R 27/26* (2013.01); *G01R 29/0814* (2013.01); *G01F 23/268* (2013.01); *G01F 25/20* (2022.01); *H01H 47/002* (2013.01)

(58) Field of Classification Search
CPC ...... G01F 23/26; G01F 23/266; G01F 23/268; G01F 23/0061; G01F 23/265; G01F 23/22; G01R 29/0814
See application file for complete search history.

(56) References Cited

U.S. PATENT DOCUMENTS

| | | | | |
|---|---|---|---|---|
| 5,083,470 | A | * 1/1992 | Davis | ..................... G01F 23/263 |
| | | | | 73/864.24 |
| 6,310,635 | B1 | * 10/2001 | Coudray | .............. B41J 2/17566 |
| | | | | 347/7 |

(Continued)

FOREIGN PATENT DOCUMENTS

| | | |
|---|---|---|
| CN | 1423405 A | 6/2003 |
| CN | 101611294 A | 12/2009 |

(Continued)

*Primary Examiner* — Sisay G Tiku
(74) *Attorney, Agent, or Firm* — Fay Kaplun & Marcin, LLP

(57) ABSTRACT

An impedance limit switch is configured to determine a limit level of a medium. The switch may include a measuring probe having an oscillator circuit; and an electronic circuit configured to generate an excitation signal for the oscillator circuit. The electronic circuit is further configured to sweep a frequency of the excitation signal and determine a resonance curve of the oscillator circuit. The electronic circuit is further configured to adapt an amplitude of the excitation signal dependent upon the resonance curve in order to reduce an EMC radiation of the switch.

10 Claims, 4 Drawing Sheets

(51) Int. Cl.
    *H01H 47/00*     (2006.01)
    *G01F 25/20*     (2022.01)

(56)            References Cited

U.S. PATENT DOCUMENTS

| | | | |
|---|---|---|---|
| 11,112,293 B2* | 9/2021 | Weinzierle | G01F 23/265 |
| 2003/0206021 A1* | 11/2003 | Laletin | G01R 31/386 |
| | | | 324/426 |
| 2006/0267452 A1 | 11/2006 | Diefenbach et al. | |
| 2010/0154546 A1 | 6/2010 | D'Angelico et al. | |
| 2012/0268139 A1 | 10/2012 | Fend et al. | |
| 2013/0076373 A1* | 3/2013 | Karenowska | G01B 7/14 |
| | | | 324/603 |
| 2016/0341955 A1 | 11/2016 | McVittie et al. | |
| 2017/0356784 A1 | 12/2017 | Griessbaum | |
| 2018/0024097 A1 | 1/2018 | D'Angelico et al. | |
| 2019/0265093 A1* | 8/2019 | Weinzierle | G01F 23/284 |
| 2020/0033278 A1* | 1/2020 | Allgaier | G01F 23/265 |

FOREIGN PATENT DOCUMENTS

| | | |
|---|---|---|
| CN | 101834473 A | 9/2010 |
| CN | 105486893 A | 4/2016 |
| CN | 107250760 A | 10/2017 |
| CN | 107646192 A | 1/2018 |
| DE | 10 2009 002 674 | 10/2010 |
| DE | 10 2009 060 742 | 7/2011 |
| EP | 0 881475 | 12/1998 |
| EP | 3 118 591 | 1/2017 |

\* cited by examiner

IMPEDANCE LIMIT SWITCH FOR REDUCING EMC RADIATION

CROSS-REFERENCE TO RELATED APPLICATIONS

This application claims the benefit of the filing date of EP Patent Application Serial No. 18 163 330.6 filed on 22 Mar. 2018, the entire content of which is incorporated herein by reference.

FIELD OF THE INVENTION

The invention relates to limit level measurement. In particular, the invention relates to an impedance limit switch configured for determining a limit level of a medium, a method for determining a limit level of a medium by means of an impedance limit switch, a program element and a computer-readable medium.

BACKGROUND

Limit level switches are used in order to detect a limit level of a filling material in or outside of a container. Typical uses for detecting such a pre-defined filling level are, for example, process tanks, storage tanks, silos or pipelines in the process industry. Limit level switches are used in a wide variety of fluids, and in granulated and powdered bulk materials.

Different limit level switches are used depending upon the properties of the filling material and the individual process conditions. There are known, for example, impedance limit switches, TDR sensors, vibration limit switches and sensors which function using the capacitive or resistive/conductive measuring principle.

A switching command issued by the limit level switch starts or stops filling devices or emptying devices such as conveyor belts or pumps.

Impedance limit switches generate an electrical field which extends into the interior of the tank. The EMC radiation associated therewith must not exceed a permitted limit value in some applications.

SUMMARY

A first aspect relates to an impedance limit switch which is configured for determining a limit level of a medium in a container. It has a measuring probe and an electronic circuit.

The measuring probe can include, in particular, a measuring electrode, a reference electrode and an inductor. In addition, a screening electrode can be provided which ensures that the electrical field lines penetrate as deeply as possible into the filling material.

The electronic circuit is configured to generate an excitation signal for an oscillator circuit which typically comprises the measuring electrode, the reference electrode and the inductor, and to feed said signal into the oscillator circuit. Furthermore, the electronic circuit is configured to pass through the frequency of this excitation signal, for example in the form of a stepless or stepped sweep and to determine a resonance curve of the oscillator circuit.

Furthermore, the electronic circuit can adapt the amplitude or voltage of the excitation signal dependent upon the resonance curve, typically in that the voltage of a transmission signal which is fed into a VCO which generates the excitation signal is adapted in order to reduce the EMC radiation of the impedance limit switch.

If the resonance curve changes, then the excitation signal normally changes, since it is responsible for the shape and the amplitude of the resonance curve. In particular, it can be provided that the amplitude of the excitation signal and thus the voltage of the transmission signal is varied dependent upon the frequency. This change of the amplitude of the excitation signal or of the voltage of the transmission signal over the frequency can hereby correspond to the shape of the resonance curve. In this case, a large change in the amplitude of the resonance curve thus causes the excitation signal to be greatly changed in this frequency range and vice versa.

These measures can cause the EMC radiation of the impedance limit switch to be reduced without worsening or at least without significant worsening of the sensitivity of the impedance measurement.

In particular, an adaptive regulation of the excitation signal can be provided (indirectly via the adaptive regulation of the transmission signal voltage) for minimising the interference radiation.

According to one embodiment, the electronic circuit is configured to adapt the amplitude of the excitation signal in a step-wise manner by means of a control loop. This is an iterative, adaptive method which can be used to bring the EMC radiation as close as possible to the limit value.

According to one embodiment, the electronic circuit is configured to ensure that a low point in the resonance curve leads to a reduction of the amplitude of the excitation signal at the frequency of the low point. This consideration is based upon the recognition that the peak in the resonance curve can lead to an increased EMC radiation. If the frequency of this peak and its amplitude are now identified, through a reduction of the amplitude of the excitation signal in the region of the peak, it can be achieved that at these frequencies, the EMC radiation decreases and, in the ideal case, has the same value as in other regions of the resonance curve.

According to a further embodiment, the electronic circuit is configured to regulate the amplitude of the excitation signal such that the EMC radiation of the impedance limit switch is substantially constant over the frequency range through which the excitation signal passes or at least only has variations which lie below a predetermined limit value. It can be provided that this limit value is able to be input by the user.

It can further be provided that the electronic circuit regulates the amplitude of the excitation signal such that the maximum EMC radiation of the impedance limit switch lies below a defined limit value. As described above, it can be provided that this limit value is able to be input by the user.

According to a further embodiment, the electronic circuit is configured to regulate the amplitude of the excitation signal such that the EMC radiation of the impedance limit switch lies close to but is always below the defined limit value. It can thus be provided that following the analysis of the first recorded resonance curve, the regulation regulates the excitation signal significantly downwardly and then regulates it up again in a stepped manner, at least partially, so that firstly, the impedance curve becomes ever flatter (the peak declines) and secondly, the amplitude of the resonance curve approaches a value which corresponds to the limit value of the permissible EMC radiation.

Advantageously, the relationship between the shape and the amplitude of the resonance curve and the associated EMC radiation is known, so that the excitation signal can be optimally set accordingly.

A further aspect relates to a method for determining a limit level of a medium in a container by means of an impedance limit switch. Initially, an excitation signal is generated for an oscillator circuit of the impedance limit switch. The oscillator circuit typically has a measuring electrode, a reference electrode and an inductor. Accordingly, the frequency of the excitation signal is passed through (in a sweep) and the resonance curve of the oscillator circuit is determined. Thereafter, an adaptation of the amplitude of the excitation signal takes place dependent upon the resonance curve, in particular upon the shape and amplitude of the resonance curve in order to reduce an EMC radiation of the impedance limit switch and, if possible, to keep it as constant as possible over the whole frequency range of the sweep.

A further aspect relates to a program element which, when it is executed on a processor of an impedance limit switch, instructs the impedance limit switch to carry out the method described above and in the following.

A further aspect relates to a computer-readable medium on which the aforementioned program element is stored.

Embodiments are described below by reference to the drawings. The illustrations in the figures are schematic and not to scale. Where, in the figures, the same reference signs are used, these relate to the same or similar elements.

DETAILED DESCRIPTION

Figure 10:
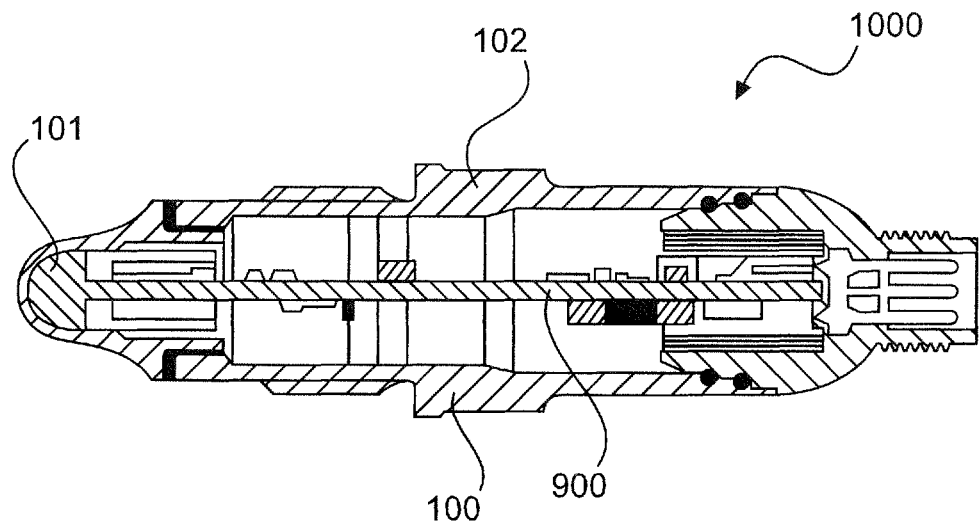
FIG. 10 shows an impedance limit switch.

FIG. 10 shows an impedance limit switch 1000. The impedance limit switch comprises an electronic circuit 900 (electronic unit) which generates an excitation signal for the oscillator circuit of the measuring probe 100. A measuring capacitance forms between the measuring electrode 101 and the reference electrode 102 which, with a discrete inductor (not shown), generates a series resonance.

The amount of the complex impedance of this oscillator circuit is analysed at, for example, between 100 MHz and 200 MHz. If there is a filling material (medium) in the region of the measuring probe, the impedance behaviour changes. Exactly this change in the impedance is made use of for the evaluation. In particular, the minimum of the resonance curve is evaluated with regard to the frequency change and the amplitude change and therefrom a switching command is generated. The generation of the oscillation frequency is achieved with a voltage-controlled oscillator (VCO). As a consequence of the measuring principle, this oscillation frequency causes an EMC radiation in the operating region.

Measures must be taken so that the EMC radiation in the working area does not exceed the permissible limit values. Suitable measures that preferably do not negatively influence the measuring functionality in order to keep the EMC radiation in the working area below the permissible limit values will now be considered.

The EMC radiation is reduced in that the electronic circuit 900 adaptively adjusts the transmission voltage (that is, the excitation signal for the oscillator circuit) to the resonance behaviour of the oscillator circuit, whereby the measuring functionality or sensitivity of the limit switch is, as far as possible, not negatively influenced.

Following the reduction of the EMC radiation, the amplitude of the resonance frequency can be increased far enough that the permissible limit value for the EMC radiation is just complied with. By this means, the emitted radiation is reduced and the interference resistance with regard to irradiation (from outside) is maximised.

A core concept lies therein that the EMC radiation of the impedance limit switch is, where possible, reduced without worsening the sensitivity of the measuring device.

The generation of the oscillation frequency of the oscillator circuit is achieved with the VCO 110 (see FIG. 9) which is controlled by means of a digital-analogue converter (DAC) 107 of the microcontroller (processor) 105. In a time period of, for example 100 ms, the frequency range of 100 MHz to 200 MHz is passed (swept) through.

Figure 1:
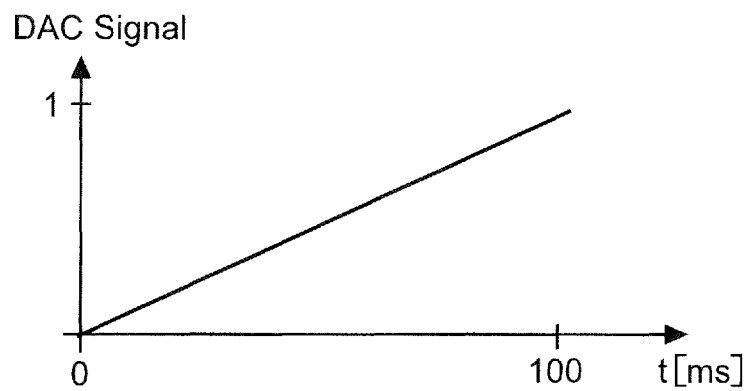
FIG. 1 shows the control signal of a DAC circuit.

FIG. 1 shows a typical control signal from the processor 105 to the DAC 107. The DAC signal has a linear shape from, for example, t=0 to t=100 ms, from a value 0 to a value 1.

Figure 9:
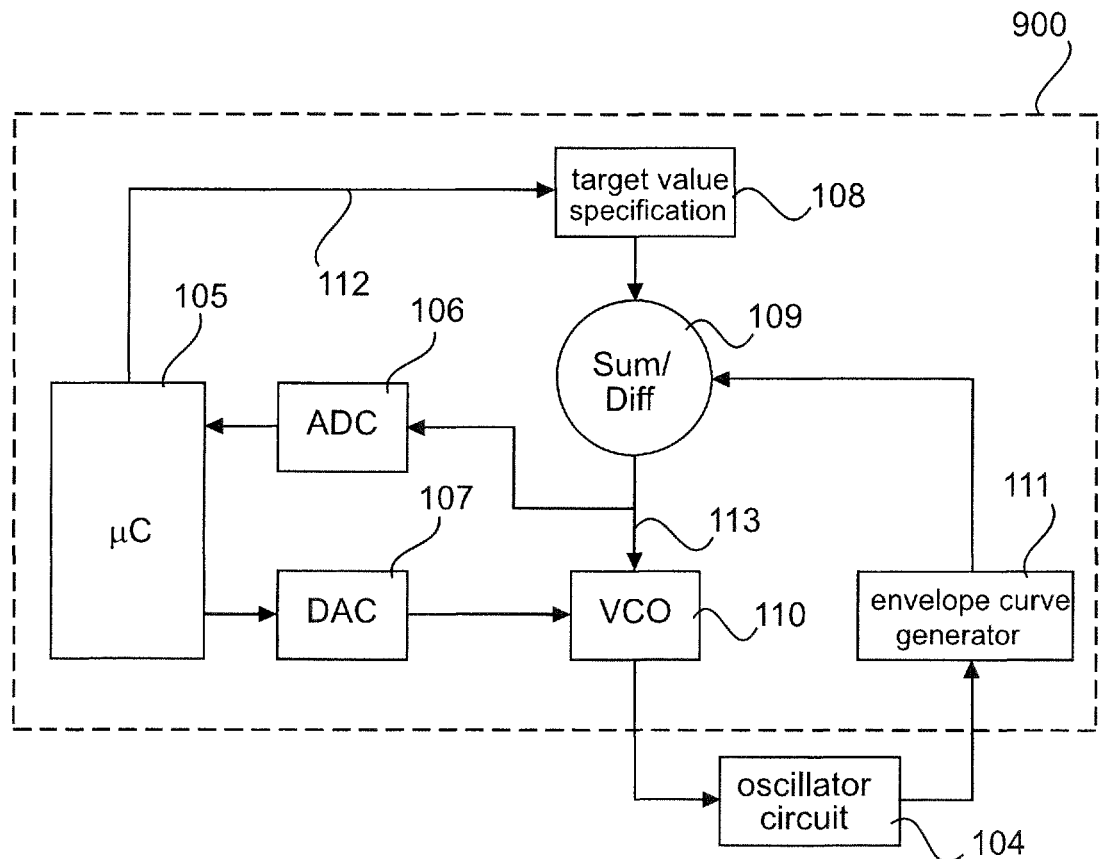
FIG. 9 shows a block circuit diagram of a further impedance limit switch.

A pre-set DAC value results in a corresponding VCO voltage and this, in turn, produces a VCO output frequency which is fed into the oscillator circuit 104 (see FIG. 9).

Figure 2:
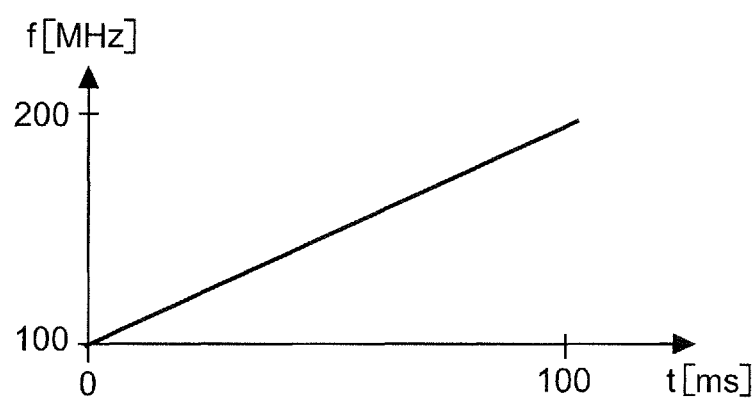
FIG. 2 shows the corresponding frequency output from a VCO.

FIG. 2 shows the VCO frequency that the VCO outputs when the DAC signal of FIG. 1 is applied to it. Here, too, the time runs from t=0 ms to t=100 ms. The frequency begins, for example, at 100 MHz and extends up to 200 MHz.

The signal of the VCO is fed to the oscillator circuit 104 of the impedance limit switch. At the resonance site 301 of the impedance limit switch, a low point 302 is obtained in the resonance curve (see FIG. 3). The resonance curve corresponds to an envelope curve and results from the sampling of the oscillator circuit signal.

Figure 3:
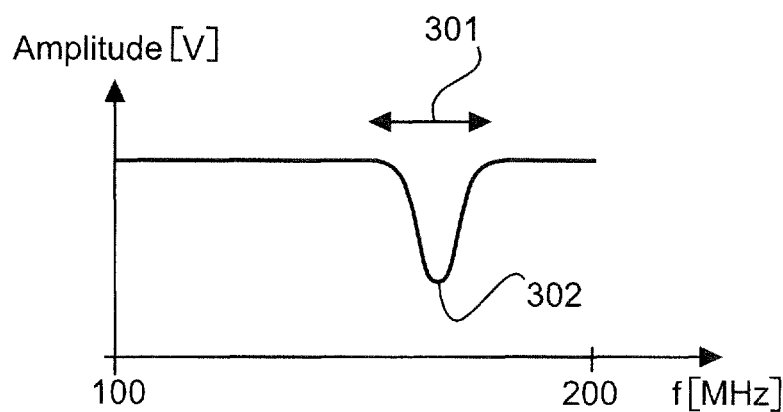
FIG. 3 shows a resonance curve of an impedance limit switch.

Obviously, the resonance curve of the impedance limit switch shown in FIG. 3 also moves between 100 MHz and 200 MHz and ultimately represents merely the voltage in the oscillator circuit which is measured at the inductor or the capacitor of the oscillator circuit.

An adaptation takes place at the resonance site, which causes the EMC radiation to be greatest at this site, since at this point the most energy flows through the oscillator circuit.

Figure 4:
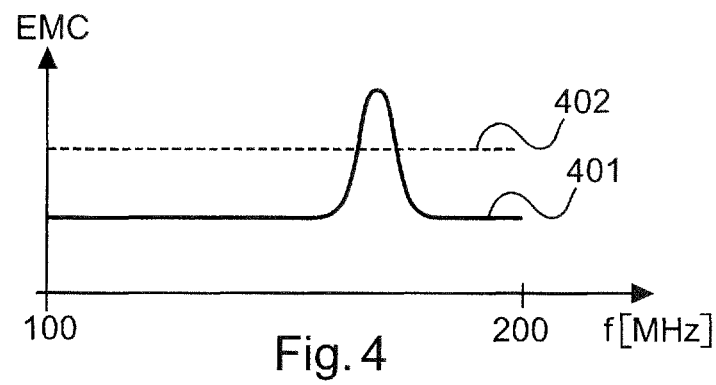
FIG. 4 shows the EMC radiation of an impedance limit switch.

FIG. 4 shows a typical EMC radiation. The horizontal line 402 indicates the permissible limit value. In the region of the resonance peak and particularly in the region of the frequency of the low point 302 (FIG. 3), the EMC radiation 401 exceeds the limit value 402 of the EMC radiation.

Figure 5:
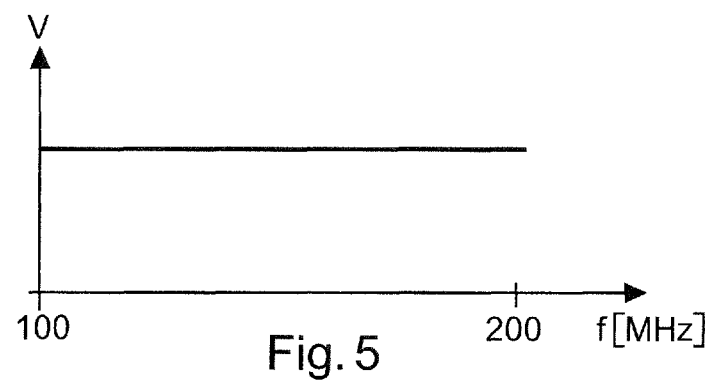
FIG. 5 shows an excitation signal (transmission voltage) of an oscillator circuit of an impedance limit switch.

The EMC radiation which is shown in FIG. 4 must be reduced in the resonance region. Typically, the transmission voltage (amplitude) is constant and only the frequency is varied. This is shown in FIG. 5.

If the transmission voltage which is supplied to the VCO is now applied, according to the measured resonance curve, the EMC radiation can be reduced in the resonance region. In the optimum case, a constant EMC radiation is obtained.

Figure 6:
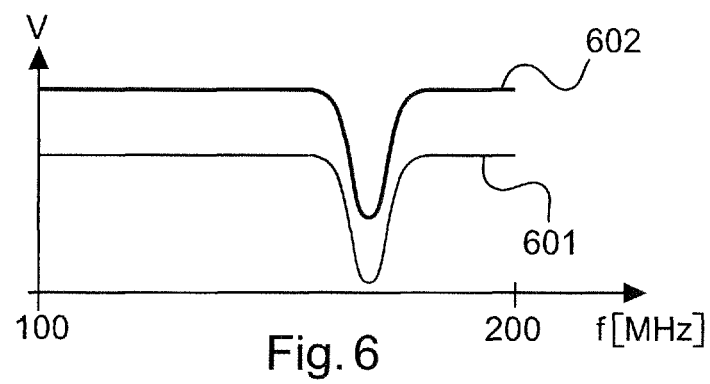
FIG. 6 shows further excitation signals of an impedance limit switch.
Figure 7:
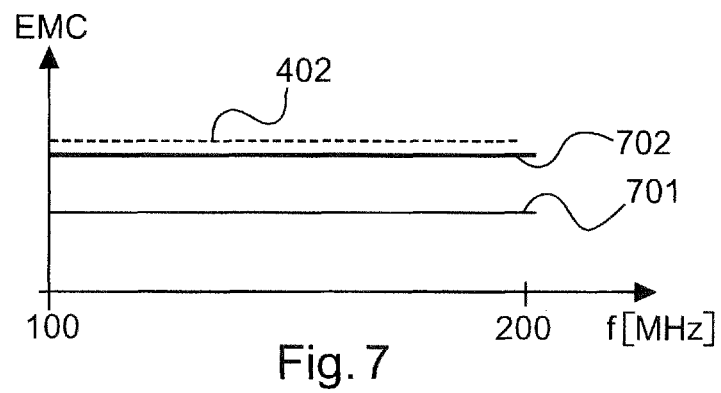
FIG. 7 shows EMC radiations of an impedance limit switch during and after the regulation of the excitation signal.

The curve 601 of FIG. 6 shows an adjusted transmission voltage and in FIG. 7, the curve 701 shows the corresponding EMC radiation.

By means of the aforementioned optimisation of the transmission voltage (see curve 601 of FIG. 6), the EMC radiation can be increased (see 701 in FIG. 7), so that, however, the limit value 402 is still not reached. Thus, the transmission voltage can be still further adapted in order to reach an optimum.

Based on these considerations, a regulation unit can be constructed which generates a constant level of the output signal or the envelope curve (resonance curve). An example of a corresponding regulating circuit is shown in FIG. 9. An envelope curve generator 111 which measures the voltage at the capacitor of the oscillator circuit or at the inductor of the oscillator circuit and generates therefrom an envelope curve (resonance curve) is connected to the oscillator circuit 104. A regulating element 109 is provided which compares this envelope curve with a target value specification 108 of the microcontroller 105 and from this, for example, forms the sum or the difference. The result is fed as a control signal (control voltage) into the VCO 110. This control signal regulates the signal amplitude of the excitation signal output by the VCO, which excitation signal is fed into the oscillator circuit 104.

At the same time, the signal generated by the unit 109 is emitted to the analogue-digital converter 106 of the electronic circuit 900, which generates therefrom a digital signal for the microcontroller 105, on the basis of which the microcontroller controls the target value specification 108. This optional, additional control signal 112 from the microcontroller 105 to the target value specification circuit 108 can be a signal which corresponds to the "inverse" envelope curve of the resonance curve. Since the EMC radiation is increased in the region of the resonance peak given a constant transmission voltage 113 at the VCO, the target value specification will be lower in this region.

The regulating circuit shown in FIG. 9 can be set so that the envelope curve generated by the envelope curve generator 111 becomes ever smoother in a step-wise manner and (in the ideal case) is largely constant over the entire frequency range, so that the EMC radiation is also constant over this frequency range and then, by means of a corresponding increase of the transmission voltage 113, the limit value can be approached from below, but without reaching it.

Figure 8:
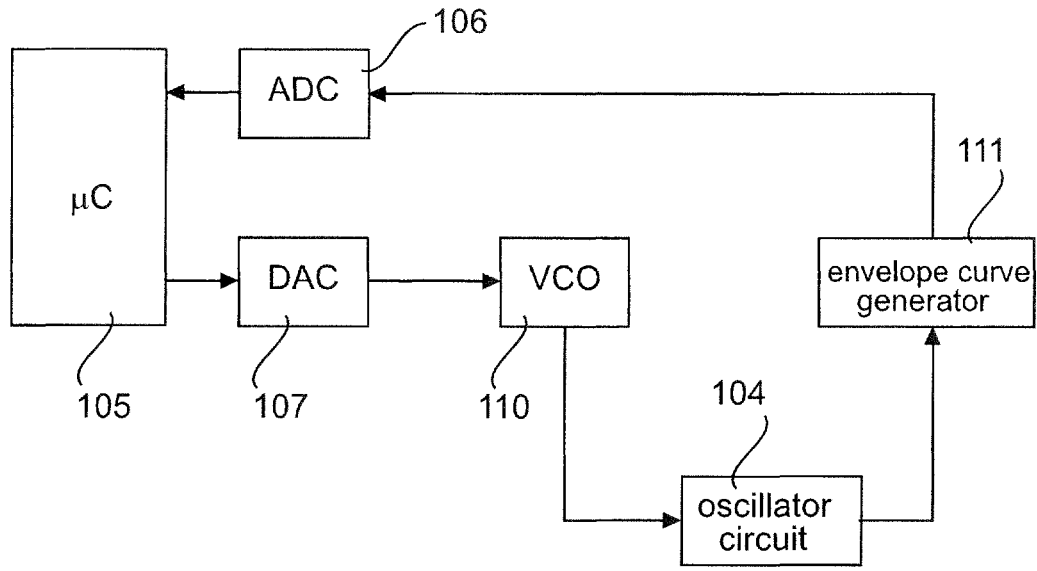
FIG. 8 shows a block circuit diagram of an impedance limit switch.

FIG. 8 shows a block circuit diagram of an impedance limit level switch without the regulation of FIG. 9.

Figure 11:
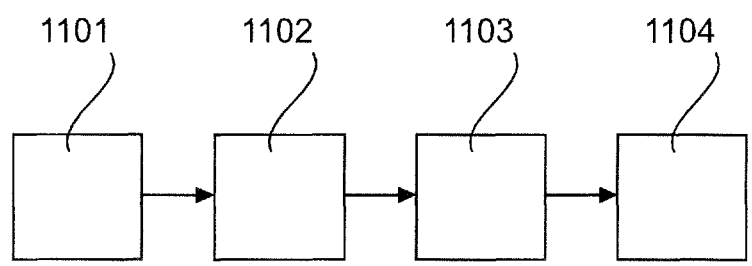
FIG. 11 shows a flow diagram of a method.

FIG. 11 shows a flow diagram of a method for determining a limit level of a medium. In step 1101, an excitation signal is generated for an oscillator circuit and is fed to the oscillator circuit. In step 1102, this excitation signal is swept through in the frequency and in step 1103, the resonance curve of the oscillator circuit is investigated, for example, in that the voltage is sampled at the inductor or at the oscillator circuit capacitor.

In step 1104, the voltage of the transmission signal, and therefore the voltage of the excitation signal of the oscillator circuit is adapted dependent upon the shape and amplitude of the resonance curve in order to reduce the EMC radiation of the impedance limit switch, to keep it largely constant over the entire frequency range and to approach a limit value from below.

In addition, it should be pointed out that "comprising" and "having" do not exclude other elements or steps, and "a/an" or "an" does not exclude a plurality. Furthermore, it should be pointed out that features or steps which have been described with reference to one of the above exemplary embodiments can also be used in combination with other features or steps of other exemplary embodiments described above. Reference characters in the claims are not to be regarded as limitations.

The invention claimed is:

1. An impedance limit switch, configured to determine a limit level of a medium, comprising:
    a measuring probe having an oscillator circuit; and
    an electronic circuit configured to generate an excitation signal for the oscillator circuit,
    wherein the electronic circuit is further configured to sweep a frequency of the excitation signal over a frequency range and to determine a resonance curve of the oscillator circuit, and
    wherein the electronic circuit is further configured to adapt an amplitude of the excitation signal dependent upon the resonance curve in order to reduce an electromagnetic compatibility (EMC) radiation of the impedance limit switch, so that the EMC radiation of the impedance limit switch is substantially constant over the frequency range through which the excitation signal passes or at least only has variations which lie below a predetermined limit value.

2. The impedance limit switch according to claim 1, wherein the electronic circuit is configured to adapt the amplitude of the excitation signal in accordance with the resonance curve.

3. The impedance limit switch according to claim 1, wherein the electronic circuit is configured to adapt the amplitude of the excitation signal in a step-wise manner using a control loop.

4. The impedance limit switch according to claim 1, wherein the electronic circuit is configured to ensure that a low point in the resonance curve leads to a reduction of the amplitude of the excitation signal at a frequency of the low point.

5. The impedance limit switch according to claim 1, wherein the electronic circuit is configured to regulate the amplitude of the excitation signal such that the EMC radiation of the impedance limit switch constant over the frequency range through which the excitation signal passes.

6. The impedance limit switch according to claim 1, wherein the electronic circuit is configured to regulate the amplitude of the excitation signal such that the EMC radiation of the impedance limit switch lies below a defined limit value.

7. The impedance limit switch according to claim 1, wherein the electronic circuit is configured to regulate the amplitude of the excitation signal such that the EMC radiation of the impedance limit switch lies close to, but still below, a defined limit value.

8. A method for determining a limit level of a medium using an impedance limit switch, comprising:
    generating an excitation signal for an oscillator circuit;
    sweeping a frequency of the excitation signal over a frequency range;
    determining a resonance curve of the oscillator circuit;
    adapting an amplitude of the excitation signal dependent upon the resonance curve in order to reduce an electromagnetic compatibility (EMC) radiation of the impedance limit switch, so that the EMC radiation of the impedance limit switch is substantially constant over the frequency range through which the excitation signal passes or at least only has variations which lie below a predetermined limit value.

9. A program element which, when it is executed on a processor of an impedance limit switch, instructs the impedance limit switch to carry out the following steps:
   generating an excitation signal for an oscillator circuit;
   sweeping a frequency of the excitation signal over a frequency range;
   determining a resonance curve of the oscillator circuit;
   adapting an amplitude of the excitation signal dependent upon the resonance curve in order to reduce an electromagnetic compatibility (EMC) radiation of the impedance limit switch, so that the EMC radiation of the impedance limit switch is substantially constant over the frequency range through which the excitation signal passes or at least only has variations which lie below a predetermined limit value.

10. A non-transitory computer-readable medium on which a program element according to claim 9 is stored.

* * * * *